(12) United States Patent
Wang et al.

(10) Patent No.: US 12,242,073 B2
(45) Date of Patent: *Mar. 4, 2025

(54) ELECTRONIC DEVICES WITH ADJUSTABLE HEAT EXTRACTION

(71) Applicant: Apple Inc., Cupertino, CA (US)

(72) Inventors: Forrest C. Wang, Petaluma, CA (US); Ritu Shah, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/506,884

(22) Filed: Nov. 10, 2023

(65) Prior Publication Data

US 2024/0077739 A1    Mar. 7, 2024

Related U.S. Application Data

(63) Continuation of application No. 17/406,490, filed on Aug. 19, 2021, now Pat. No. 11,852,834.

(Continued)

(51) Int. Cl.
G02B 27/01 (2006.01)
H05K 7/20 (2006.01)

(52) U.S. Cl.
CPC ..... *G02B 27/0176* (2013.01); *G02B 27/0172* (2013.01); *G02B 27/0179* (2013.01);
(Continued)

(58) Field of Classification Search
CPC .............. G02B 27/017; G02B 27/0172; G02B 27/0176; G02B 27/0179;
(Continued)

(56) References Cited

U.S. PATENT DOCUMENTS 6,724,632 B2   4/2004   Lee et al.
7,256,993 B2   8/2007   Cravens et al.
(Continued)

FOREIGN PATENT DOCUMENTS

KR   20130019792 A   2/2013
KR   20180015469 A   2/2018

*Primary Examiner* — Robin J Mishler
*Assistant Examiner* — Cory A Almeida
(74) *Attorney, Agent, or Firm* — Treyz Law Group, P.C.; G. Victor Treyz; Kendall P. Woodruff

(57) ABSTRACT

A head-mounted device may have a head-mounted housing. The head-mounted housing may have rear-facing displays that display images for a user. The images are viewable from eye boxes while the head-mounted device is being worn by the user. The displays may be mounted in left and right optical modules that have respective left and right lenses. A positioning system may be used to adjust the spacing between the left and right optical modules to accommodate different interpupillary distances. An adjustable heat extraction system may be provided that includes fans configured to force air between airflow inlets and outlets past heat sinks. The heat sinks may have fins that are adjusted in orientation and/or that are otherwise adjusted based on changes in optical module spacing. The airflow inlets and/or outlets may have adjustable louvers or other movable members that allow these ports to be fully opened, fully closed, or partly closed.

18 Claims, 13 Drawing Sheets

Related U.S. Application Data

(60) Provisional application No. 63/076,816, filed on Sep. 10, 2020.

(52) U.S. Cl.
CPC ..... *H05K 7/20145* (2013.01); *H05K 7/20154* (2013.01); *H05K 7/20209* (2013.01); *G02B 2027/0163* (2013.01)

(58) Field of Classification Search
CPC ....... G02B 2027/0163; H05K 7/20145; H05K 7/20154; H05K 7/20209
See application file for complete search history.

(56) References Cited

U.S. PATENT DOCUMENTS

| | | |
|---|---|---|
| 9,507,391 B2 | 11/2016 | Busch et al. |
| 9,625,220 B1 | 4/2017 | Ahbel et al. |
| 10,088,244 B2 | 10/2018 | Bodenweber et al. |
| 10,859,843 B1 | 12/2020 | Tempel et al. |
| 2002/0089601 A1 | 7/2002 | Fumio et al. |
| 2013/0138262 A1 | 5/2013 | Busch et al. |
| 2016/0245493 A1* | 8/2016 | Eustace .................. F21V 29/81 |
| 2017/0131047 A1* | 5/2017 | Ahbel ..................... F28F 13/08 |
| 2018/0067317 A1* | 3/2018 | Barton ............... G02B 27/0176 |
| 2019/0075689 A1* | 3/2019 | Selvakumar ......... G02B 27/017 |

* cited by examiner

ELECTRONIC DEVICES WITH ADJUSTABLE HEAT EXTRACTION

This application is a continuation of patent application Ser. No. 17/406,490, filed Aug. 19, 2021, which claims the benefit of provisional patent application No. 63/076,816, filed Sep. 10, 2020, both of which are hereby incorporated by reference herein in their entireties.

FIELD

This relates generally to electronic devices, and, more particularly, to electronic devices such as head-mounted devices.

BACKGROUND

Electronic devices such as head-mounted devices may have displays for displaying images. The displays may be housed in a head-mounted support structure. During operation, components such as displays may generate heat.

SUMMARY

A head-mounted device may have a head-mounted housing. The head-mounted housing may have rear-facing displays that display images for a user. The images are viewable from eye boxes while the head-mounted device is being worn by the user.

The displays may be mounted in left and right optical modules with respective left and right lenses. A positioning system may be used to adjust the spacing between the left and right optical modules to accommodate different user interpupillary distances.

A heat extraction system may be provided for the head-mounted device. The heat extraction system may be adjusted by control circuitry in the device. The heat extraction system may, for example, be adjusted to ensure that heat extraction efficiency is satisfactory, even as the positions of optical modules or other components within the device are moved.

The heat extraction system may include fans configured to force air to flow between airflow inlets and outlets while passing over heat sinks. The heat sinks may have fins that are adjusted in orientation and/or that are otherwise adjusted based on changes in optical module spacing. The airflow inlets and/or outlets may have adjustable louvers or other structures that allow these ports to be fully opened, fully closed, or partly closed.

DETAILED DESCRIPTION

An electronic device such as a head-mounted device may have displays and other electrical components that generate heat. To ensure that the components do not overheat during operation, the electronic device may be provided with a heat extraction system. The heat extraction system may have heat sinks and fans. Air may be drawn into an interior region of the head-mounted device through an airflow inlet. After passing over a heat sink, the air, which is now heated, may be expelled through an airflow outlet. This process cools the heat sink and any heat-generating electrical component that is thermally coupled to the heat sink.

A head-mounted device may have optical modules in which displays and lenses are mounted. Actuators may be mounted in the head-mounted device. The actuators may be used to adjust the spacing between left and right optical modules to accommodate different interpupillary distances for different users. Each optical module may contain a display and a lens. During operation, images on the displays may be viewed through the lenses. The heat extraction system may be used to ensure that the displays remain at satisfactorily low operating temperatures.

The head-mounted may include a head-mounted support structure that allows the device to be worn on the heads of users. Airflow inlets and outlets may be formed in the head-mounted support structure. Adjustable structures may be provided in these airflow ports. The adjustable structures may be used to adjust the opening and closing of the ports.

In some configurations, heat-sink structures in the heat extraction system may be adjusted. For example, heat sink fins may be adjusted. The adjustment of the heat sink structures may be made to ensure that airflow through the heat extraction system is satisfactory over a variety of different operating conditions. For example, heat sink fin orientation may be adjusted in response to optical module spacing adjustments or other changes in the positions of parts within the head-mounted device.

Figure 1:
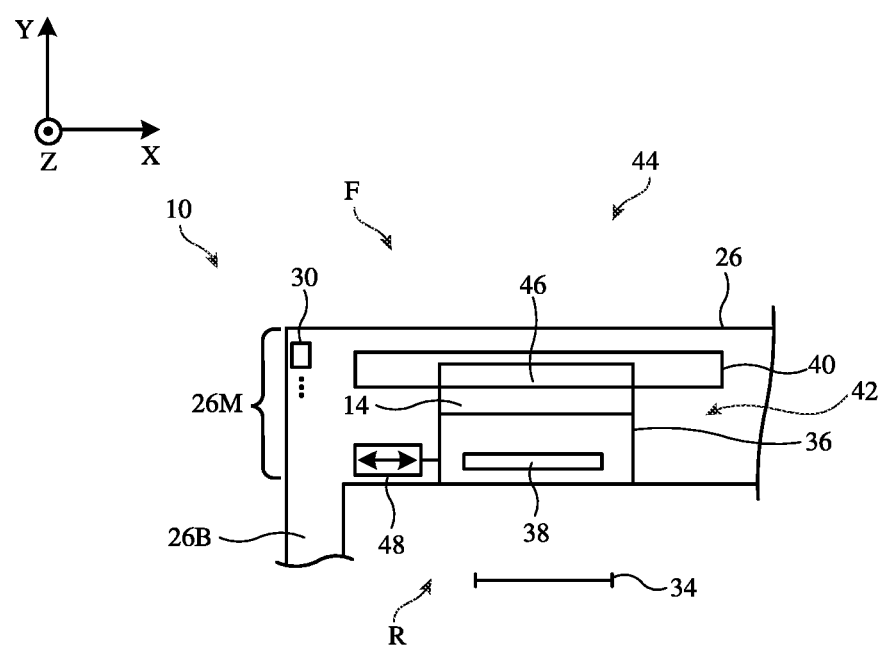
FIG. 1 is a top view of a portion of an illustrative electronic device such as a head-mounted device in accordance with an embodiment.

FIG. 1 is a top view of an illustrative head-mounted electronic device. As shown in FIG. 1, head-mounted device 10 may include head-mounted support structure 26. Support structure 26, which may sometimes be referred to as a housing or enclosure, may have walls or other structures that separate an interior region of device 10 such as interior region 42 from an exterior region surrounding device 10 such as exterior region 44. Electrical components 30 (e.g., integrated circuits, sensors, control circuitry, input-output devices, etc.) may be mounted on printed circuits and/or other structures within device 10 (e.g., in interior region 42).

To present a user with images for viewing from eye boxes such as eye box 34, device 10 may include displays such as display 14 and lenses such as lens 38. These components may be mounted in optical modules such as optical module 36 (e.g., a lens barrel) to form respective left and right optical systems. There may be, for example, a left display for presenting an image through a left lens in a left optical module to a user's left eye in a left eye box and a right display for presenting an image through a right lens in a right optical module to a user's right eye in a right eye box.

The user's eyes are located in eye boxes 34 when rear face R of structure 26 rests against the outer surface of the user's face. Each optical module may have an associated positioner such as actuator 48 of FIG. 1. Actuators 48 may be motors, solenoids, other electromagnetic actuators, or other positioners that form an optical module positioning system for device 10. The positioning system formed by actuators 48 may be used to move optical modules 36 towards and away from each other. For example, actuators 48 may be used to adjust the spacing between the left and right optical modules to accommodate different interpupillary distances associated with different users.

Support structure 26 may include a main housing support structure such as portion 26M. Main housing portion 26M may have a portion on front face F of device 10. An optional forward-facing publicly viewable display may be mounted on front face F. This display may face in the opposite direction from rear-facing displays such as displays 14 in optical modules 36. If desired, support structure 26 may include optional head straps (sometimes referred to as headbands) such as strap 26B and/or other head-mounted support structures that are configured to extend around the head of the user to help support device 10 on the head of the user during use.

Device 10 may have a heat extraction system. The heat extraction system may include one or more fans that draw air into interior region 42 through one or more air inlets and that force the air past one or more heat sinks before expelling the air through one or more air outlets. Heat sinks may be thermally and physically coupled to electrical components in device 10 that generate heat. In the example of FIG. 1, heat sink 46 has been coupled to display 14. Fan 40 forces air past heat sink 46 to help cool heat sink 46 and thereby cool display 14. There may be a left heat sink associated with a left display and a right heat sink associated with a right display (as an example).

Figure 2:
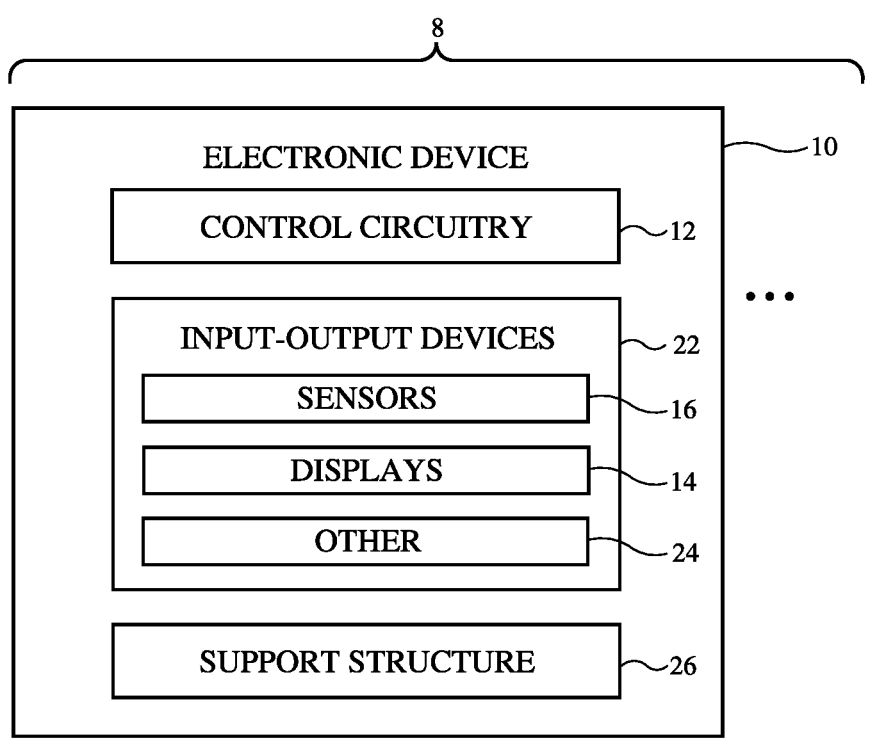
FIG. 2 is schematic diagram of an illustrative system with an electronic device in accordance with an embodiment.

A schematic diagram of an illustrative system that may include a head-mounted device is shown in FIG. 2. As shown in FIG. 2, system 8 may have one or more electronic devices such as device 10. The electronic devices in system 8 may include a head-mounted device (e.g., device 10 of FIG. 1), accessories such as headphones, associated computing equipment (e.g., a cellular telephone, tablet computer, laptop computer, desktop computer, and/or remote computing equipment that supplies content to a head-mounted device), and/or other devices that communicate with the head-mounted device.

Each electronic device if system 8 may have control circuitry 12. Control circuitry 12 may include storage and processing circuitry for controlling the operation of the electronic device. Circuitry 12 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 12 may be based on one or more microprocessors, microcontrollers, digital signal processors, baseband processors, power management units, audio chips, graphics processing units, application specific integrated circuits, and other integrated circuits. Software code may be stored on storage in circuitry 12 and run on processing circuitry in circuitry 12 to implement control operations for the electronic device (e.g., data gathering operations, operations involving the adjustment of the components of the device using control signals, etc.). Control circuitry 12 may include wired and wireless communications circuitry. For example, control circuitry 12 may include radio-frequency transceiver circuitry such as cellular telephone transceiver circuitry, wireless local area network transceiver circuitry (e.g., WiFi® circuitry), millimeter wave transceiver circuitry, and/or other wireless communications circuitry.

To support interactions with external equipment, control circuitry 12 may be used in implementing communications protocols. Communications protocols that may be implemented using control circuitry 12 include internet protocols, wireless local area network protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols, cellular telephone protocols, multiple-input and multiple-output (MIMO) protocols, antenna diversity protocols, satellite navigation system protocols such as global positioning system (GPS) protocols and global navigation satellite system (GLONASS) protocols, IEEE 802.15.4 ultra-wideband communications protocols or other ultra-wideband communications protocols, etc. Each communications protocol may be associated with a corresponding radio access technology (RAT) that specifies the physical connection methodology used in implementing the protocol.

During operation, the communications circuitry of each electronic device in system 8 (e.g., the communications circuitry of control circuitry 12) may be used to support communication between the electronic devices. For example, one electronic device may transmit video data, audio data, and/or other data to another electronic device in system 8. Electronic devices in system 8 may use wired and/or wireless communications circuitry to communicate through one or more communications networks (e.g., the internet, local area networks, etc.). The communications circuitry may be used to allow data to be received by an electronic device from external equipment (e.g., a tethered computer, a portable device such as a handheld device or laptop computer, online computing equipment such as a remote server or other remote computing equipment, or other electrical equipment) and/or to provide data to external equipment.

Each electronic device in system 8 may include input-output devices 22. Input-output devices 22 may be used to allow a user to provide device 10 with user input. Input-output devices 22 may also be used to gather information on the environment in which device in system 8 is operating. Output components in devices 22 may allow an electronic device in system 8 to provide a user with output and may be used to communicate with external electrical equipment.

As shown in FIG. 2, input-output devices 22 may include one or more displays such as displays 14. In some configurations, an electronic device in system 8 such as device 10 includes left and right display devices. Device 10 may, for example, include left and right components such as left and right scanning mirror display devices or other image projectors, liquid-crystal-on-silicon display devices, digital mirror devices, or other reflective display devices, left and right display panels based on light-emitting diode pixel arrays (e.g., organic light-emitting display panels or display devices based on pixel arrays formed from crystalline semiconductor light-emitting diode dies), liquid crystal display panels, and/or or other left and right display devices that provide images to left and right eye boxes for viewing by the user's left and right eyes, respectively.

During operation, displays 14 may be used to display visual content for a user of device 10. The content that is presented on displays 14 may include virtual objects and other content that is provided to displays 14 by control circuitry 12. This virtual content may sometimes be referred to as computer-generated content. Computer-generated content may be displayed in the absence of real-world content or may be combined with real-world content. In some configurations, a real-world image may be captured by a camera (e.g., a forward-facing camera, sometimes referred to as a front-facing camera) so that computer-generated content may be electronically overlaid on portions of the real-world image (e.g., when device 10 is a pair of virtual reality goggles).

Input-output circuitry 22 may include sensors 16. Sensors 16 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional light detection and ranging sensors, sometimes referred to as lidar sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, capacitive proximity sensors, light-based (optical) proximity sensors, other proximity sensors, force sensors (e.g., strain gauges, capacitive force sensors, resistive force sensors, etc.), sensors such as contact sensors based on switches, gas sensors, pressure sensors, moisture sensors, magnetic sensors, audio sensors (microphones), ambient light sensors, microphones for gathering voice commands and other audio input, sensors that are configured to gather information on motion, position, and/or orientation (e.g., accelerometers, gyroscopes, compasses, and/or inertial measurement units that include all of these sensors or a subset of one or two of these sensors), encoders or other position sensors configured to measure the positions of parts within device 10, and/or other sensors.

User input and other information may be gathered using sensors and other input devices in input-output devices 22. If desired, input-output devices 22 may include other devices 24 such as haptic output devices (e.g., vibrating components), light-emitting diodes and other light sources (e.g., infrared light-emitting diodes and/or visible light-emitting diodes), speakers such as ear speakers for producing audio output, circuits for receiving wireless power, circuits for transmitting power wirelessly to other devices, batteries and other energy storage devices (e.g., capacitors), joysticks, buttons, and/or other components.

Electronic device 10 may have head-mounted support structures such as head-mounted support structure 26 (e.g., head-mounted housing structures such as housing walls, straps, etc.). The head-mounted support structure may be configured to be worn on a head of a user (e.g., against the user's face covering the user's eyes) during operation of device 10 and may support displays 14, sensors 16, other components 24, other input-output devices 22, and control circuitry 12 (see, e.g., components 30 and optical module 36 of FIG. 1).

Figure 3:
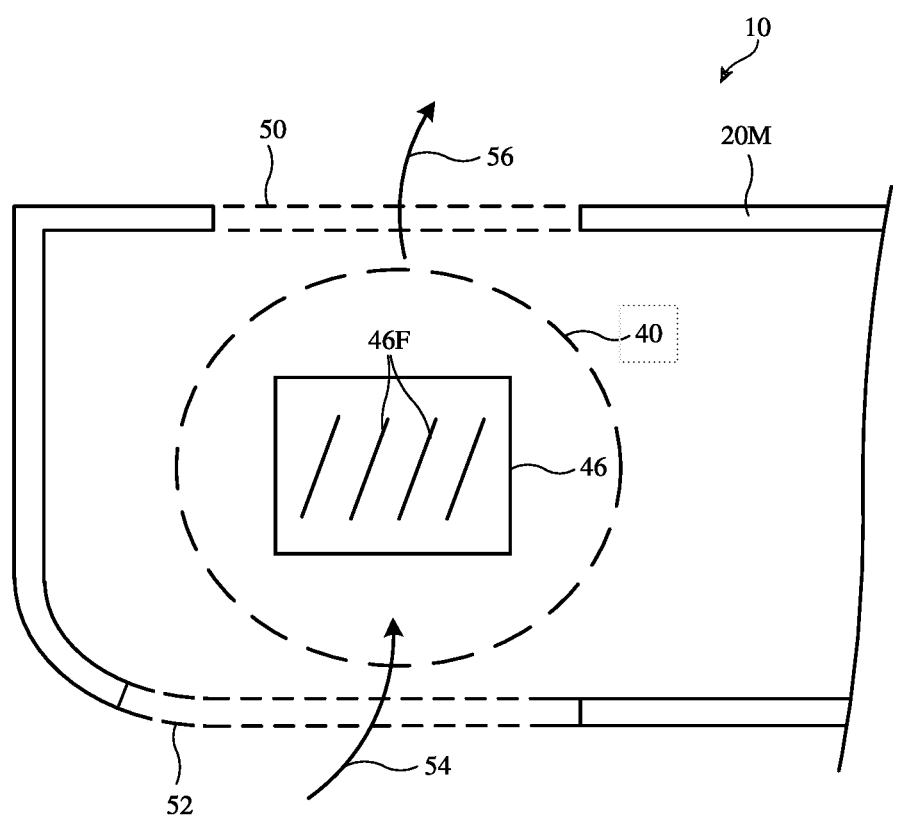
FIG. 3 is a rear view of a portion of an electronic device in accordance with an embodiment.

FIG. 3 is a rear view of device 10 in an illustrative configuration in which device 10 has a heat extraction system that is being used to cool displays 14. Main portion 26M of head-mounted support structure 26 may have openings that form airflow ports. In the example of FIG. 3, portion 26M has a lower edge with a lower opening that forms airflow inlet 52 and an upper edge with an upper opening that forms airflow outlet 50. Air may flow into device 10 through inlet 52 in direction 54 and may be expelled from device 10 through outlet 50 in direction 56. There may be any suitable number of airflow ports in device 10. In an illustrative configuration, portion 26M has left and right airflow inlets located along the lower edge of head-mounted support structure 26 and has corresponding left and right airflow outlets located along the upper edge of head-mounted support structure 26.

The heat extraction system of FIG. 3 includes heat sink 46 and fan 40. There may be left and right heat sinks and left and right fans in device 10. Each fan may force air from a corresponding airflow inlet 52 past a corresponding heat sink 46 and out of a corresponding airflow outlet 50 to cool a respective display 14. Heat sinks 46 may contain structures that facilitate the flow of heat out of the body of the heat sink into the air that is passing over the heat sink. For example, heat sink 46 of FIG. 3 may include fins 46F. Heat sink fins and other heat sink structures may be formed from thermally conductive material such as metal.

The heat extraction system of device 10 may contain actuators and other components (e.g., fans 40) that can be electrically adjusted by control circuitry 12. During operation of device 10, control circuitry 12 can gather information from temperature sensors, optical module position sensors (e.g., position encoders in actuators 48), and/or other sensors 16 in device 10. Device 10 can also determine information about the current operating state of device 10 such as the brightness of displays 14, the type of content being displayed on displays 14, etc. Based on this information, control circuitry 12 can determine whether fans 40 should be adjusted (e.g., to increase cooling by increasing fan speed) and/or whether other heat extraction system components should be adjusted.

In an illustrative configuration, device 10 (e.g., head-mounted support structure 26) may have adjustable airflow ports. Adjustable louvers or other mechanically movable structures in airflow inlet 52 and/or in airflow outlet 50 may be adjusted to adjust the visibility of these ports and/or to adjust airflow through the ports. If as an example, it is desired to provide device 10 with enhance heat extraction capabilities, the airflow inlets and outlets may be fully opened. If as another example, the speed of fans 40 has been set to an intermediate level and the heat extraction load of the heat extraction system is relatively modest, the airflow inlets and/or outlets may be partly closed to help hide interior structures from view and thereby enhance the appearance of device 10. In scenarios in which small amounts of heat are being generated and/or when heat-generating components and/or device 10 are off or are in a low-power sleep mode, the inlets and/or outlets of device 10 may be closed. Fully closing these ports or even partly closing these ports may help prevent dust and other contaminants from entering the interior of device 10 and may enhance the outward appearance of device 10 (e.g., by visually obscuring the presence of openings in structure 26). In addition to or instead of adjusting inlet and outlet ports in device 10, device 10 may also adjust components such as heat sinks 46 and/or other heat extraction system components.

Figure 4:
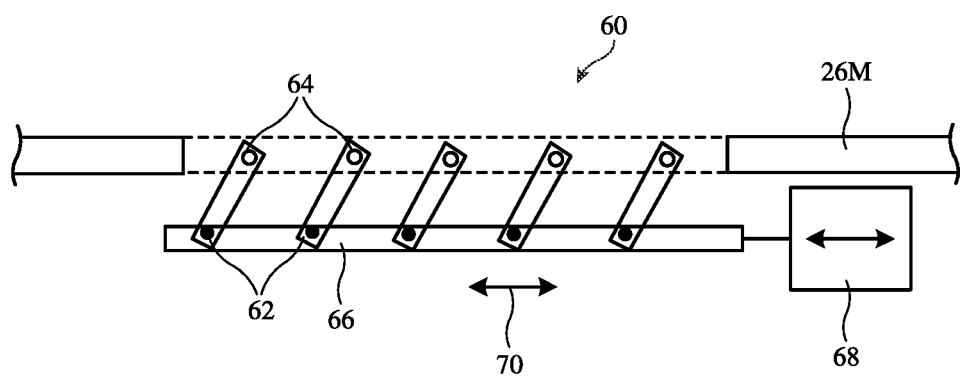
FIG. 4 is a cross-sectional side view of a portion of an electronic device with an adjustable airflow port in accordance with an embodiment.

FIG. 4 is a cross-sectional side view of an illustrative adjustable airflow port in device 10. Airflow port 60 of FIG. 4 may be an airflow inlet such as inlet 52 or an airflow outlet such as airflow outlet 50. As show in FIG. 4, airflow port 60 may have movable members such as port louvers 62. Actuator 68 may be used to move these movable members to fully open, partially close, or completely close port 60. Actuator 68 may be, for example, a linear actuator that moves an elongated member such as bar 66 in directions 70. Bar 66 is coupled to one end of each of louvers 62. The opposing end of each louver is coupled to a respective hinge 64 about which that louver rotates. By adjusting the lateral position of bar 66 using actuator 68, the rotation of all louvers 62 may be controlled in parallel, thereby allowing actuator 68 to adjust the opening state of port 60 in response to control commands from control circuitry 12.

Figure 5:
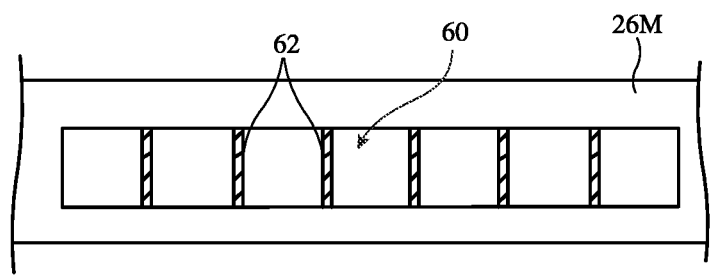
FIGS. 5, 6, and 7 are views of illustrative adjustable airflow ports respectively in fully open, partly closed, and fully closed states in accordance with embodiments.
Figure 6:
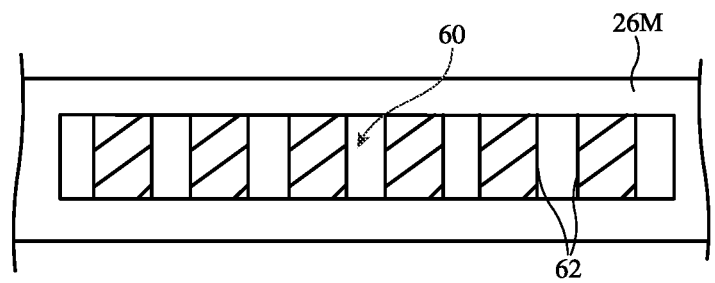
Figure 7:
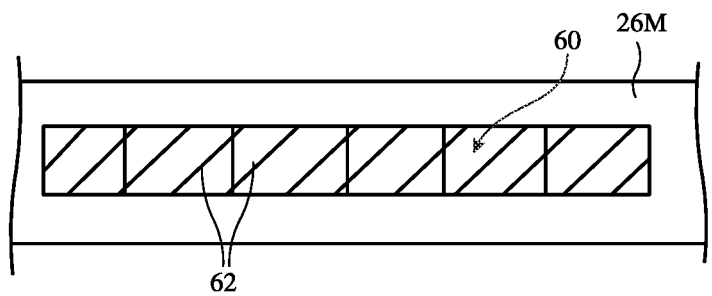

FIG. 5 shows louvers 62 in a fully opened state. In this state, louvers 62 are oriented vertically (in the orientation of FIG. 4) and airflow through port 60 is high. FIG. 6 shows louvers 62 in a partly closed state. In this configuration, louvers 62 are slightly angled away from vertical and partly obstruct port 60. Contaminant ingress risk is reduced and the appearance of device 10 may be enhanced in this configuration. In the illustrative arrangement of FIG. 7, louvers 62 have been placed in a horizontal configuration by actuator 68. This fully closes port 60 to help prevent contaminant ingress through port 60. Full closure of port 60 may also help enhance the appearance of device 10 by visually obscuring the presence of port 60.

Figure 8:
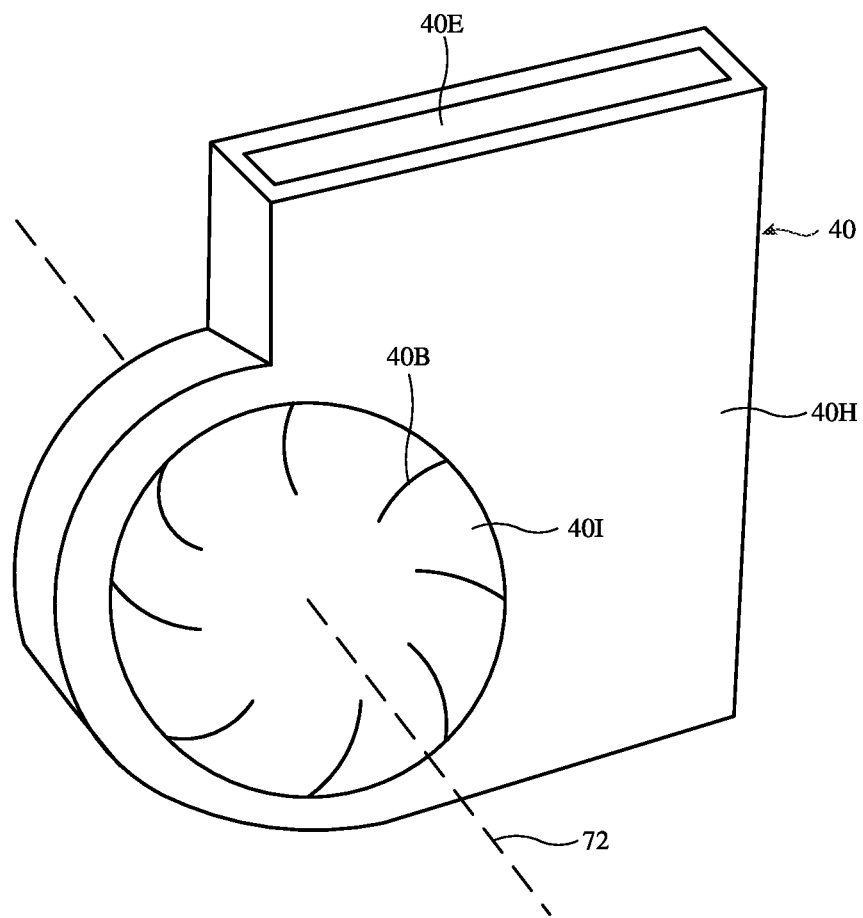
FIG. 8 is a perspective view of an illustrative heat extraction fan in accordance with an embodiment.

FIG. 8 is a perspective view of an illustrative fan for a heat extraction system in device 10. Other types of fan may be used in device 10, if desired. Fan 40 in the example of FIG. 8 includes fan housing 40H. An opening in fan housing 40H may form fan inlet 40I. Fan blades 40B may be rotated about rotational axis 72 by a motor in fan 40 to draw air into inlet 40I and expel air through corresponding fan outlet 40E. When fan 40 is installed within device 10, fan outlet 40E may be aligned with airflow outlet 50 of main portion 26M of support structure 26 (FIG. 3).

Figure 9:
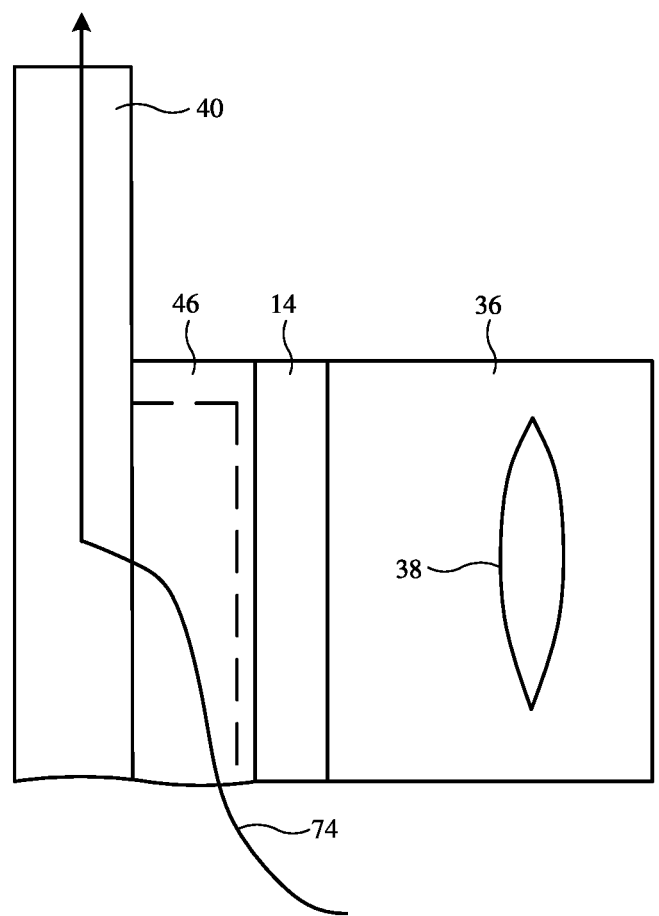
FIG. 9 is a side view of an illustrative heat extraction system being used to cool a heat-generating electrical component such as a display in an optical module in accordance with an embodiment.

FIG. 9 is a cross-sectional side view of an illustrative optical module that is being cooled by a heat extraction system. In the illustrative configuration of FIG. 9, heat sink 46 has been mounted to the inner surface of display 14. Pixels on the opposing rear-facing surface of display 14 may display images that are viewable through lens 38. The fins of heat sink 46 may be exposed to air flowing along path 74 from air inlet 52 (FIG. 3) to airflow outlet 50 (FIG. 3) through fan 40. This cools heat sink 46 and helps cool display 14, which is thermally and physically connected to heat sink 46.

Figure 10:
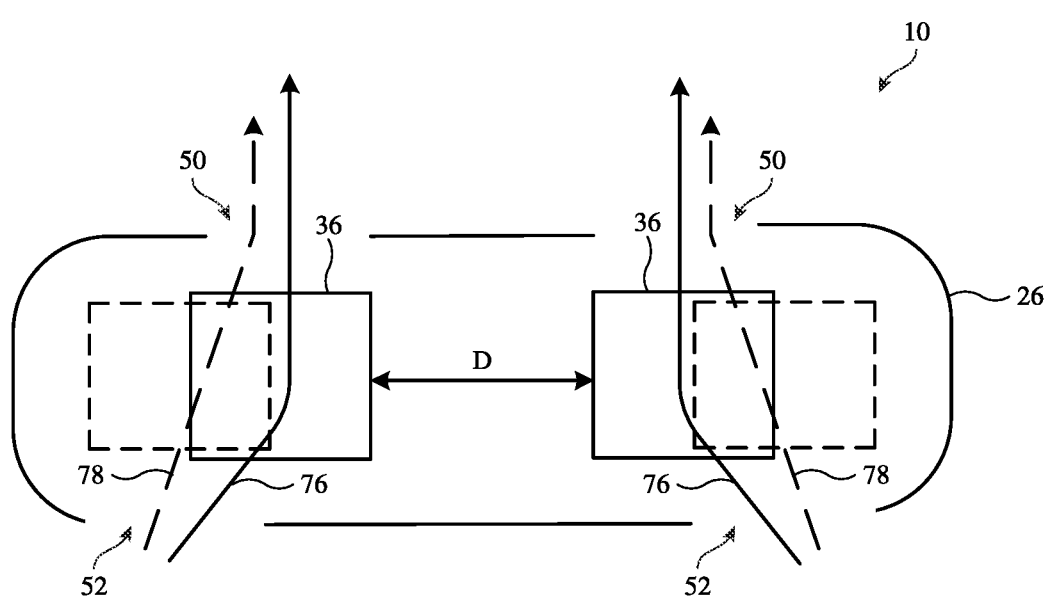
FIG. 10 is a rear view of an illustrative head-mounted device with optical modules that may be moved to accommodate different interpupillary distances in accordance with an embodiment.

To accommodate users with different interpupillary distances, display 10 may have left and right optical module positioners (see, e.g., actuator 48 of FIG. 1, which is configured to move optical module 36 parallel to the X-axis). FIG. 10 is a rear view of device 10 in an illustrative configuration in which the spacing D between left and right optical modules 36 can be adjusted using actuators 48. Changes to optical module separation (e.g., adjustments to the value of spacing D) can affect airflow through the heat extraction system. As shown in FIG. 10, for example, cooling air may flow along first paths 76 between inlets 52 and outlets 50 when modules 36 are separated by a relatively small distance D and may flow along altered paths 78 between inlets 52 and outlets 50 when modules are separated by a larger distance D.

The difference between the shapes and lengths of paths 76 and 78 and the relative orientation between the direction of the flow of air and components in the heat extraction system such as heat sink fins 46F can alter the resistance of the heat extraction system to airflow (sometimes referred to as airflow impedance). As a result, there is a risk that heat extraction efficiency might decrease when device 10 is used in some interpupillary distance settings. To combat this risk and help ensure that heat extraction efficiency is satisfactory over a range of different interpupillary distance settings (e.g. a range of different optical module spacings D), heat sinks 46 may be adjusted dynamically. For example, heat sink fin adjustments such as changes to the angular orientation and/or other adjustments may be made by control circuitry 12 to fins 46F using individually adjustable heat-sink adjustment actuators and/or by exploiting the movement of actuators 48 that arises when adjusting spacing D by moving modules 36.

Figure 11:
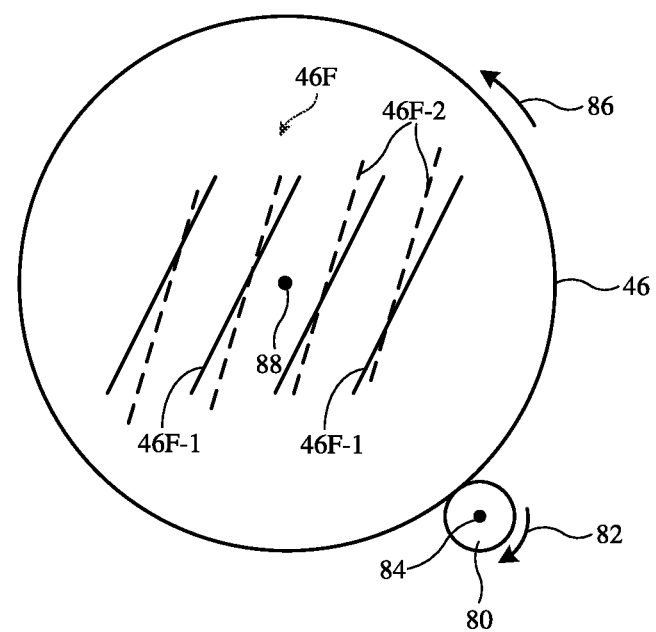
FIG. 11 is a rear view of an illustrative adjustable heat sink in accordance with an embodiment.

As an example, control circuitry 12 can monitor the spacing D (e.g., using a position encoder in actuator 48 or other sensor 16 that can measure the value of D). Using the measured value of D, control circuitry 12 can determine a satisfactory orientation for fins 46F. Control circuitry 12 can then use an heat sink actuator that is coupled to heat sink 46 to change the orientation of fins 46F. This type of arrangement is shown in FIG. 11. As shown in FIG. 11, heat sink 46 may have fins 46F. Initially, the spacing D between optical modules 36 is D1 and fins 46F are oriented in orientation 46F-1 of FIG. 11. In response to determining that the value of spacing D has changed to D2, which is different than D1, control circuitry 12 can use an actuator that is coupled to heat sink 46 such as actuator 80 of FIG. 11 to change the orientation of fins 46F to orientation 46F-2 of FIG. 11. Actuator 80 may adjust the fin orientation by rotating a wheel or circular gear in the actuator in direction 82 about axis 84 (as an example), which causes heat sink 46 and fins 46F to rotate about axis 88 in direction 86 to change the orientation of fins 46F. If desired, gears or other structures may be used to transfer force from the lateral movement of optical modules 36 (to adjust D) directly into movement (e.g., rotation) of heat sinks 46. In this type of arrangement, control circuitry 12 need only adjust the spacing D between optical modules 36 with actuators 48 in order to ensure that corresponding adjustments are made to the orientation of fins 46F.

Figure 12:
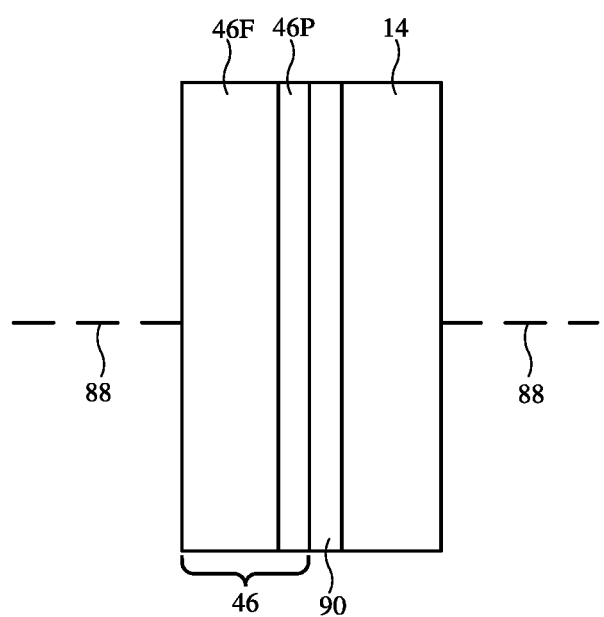
FIG. 12 is a cross-sectional side view of an illustrative adjustable heat sink coupled to an optical module display in accordance with an embodiment.

To help ensure that there is satisfactory thermal conduction between the inner surface of display 14 and heat sink 46, a layer of thermally conductive material 90 (e.g., thermally conductive grease, gel, oil, etc.) may be interposed between heat sink 46 and display 14, as shown in FIG. 12. Heat sink 46 may have a support plate such as plate 46P that rotates about axis 88 or otherwise changes orientation due to applied force from actuator 80 and fins 46F that protrude from plate 46P. With this type of configuration, satisfactory heat transfer from display 14 to heat sink fins 46F may be maintained, even as the orientation of fins 46F is adjusted.

Figure 13:
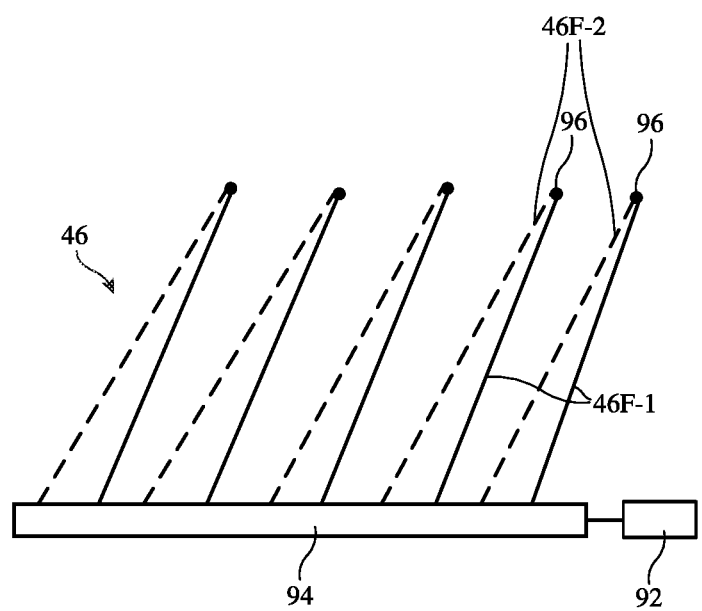
FIG. 13 is a cross-sectional side view of an illustrative heat sink with adjustable fins in accordance with an embodiment.

Another illustrative configuration for adjusting the orientation of heat sink fins 46F is shown in FIG. 13. In the example of FIG. 13, heat sink orientation is adjusted by a heat sink positioner such as actuator 92. If desired, heat sink orientation may be adjusted using force from an optical module positioner such as actuator 48 of FIG. 1 (e.g., actuator 48 may be coupled both to one of modules 36 and to heat sink 46, so that movement of actuator 48 may to adjust spacing D and to simultaneously rotate or otherwise adjust the orientation of heat sink 46).

In the FIG. 13 arrangement, fins 46 may initially be in orientation 46F-1. Following lateral movement of member 94 due to force from actuator 92 (or actuator 48), fins 46F, which are coupled at their ends to member 94, may rotate about fin hinges 96 to orientation 46F-2. Adjustments such as these may be made, for example, to help compensate for airflow impedance changes that might otherwise arise from changes in the positions of optical modules 36, fan speed changes, and/or other adjustments to the components of device 10 that affect heat extraction system performance. For example, adjustments to heat sink fin orientation may help ensure that the heat extraction system maintains satisfactory efficiency over a range of different interpupillary distance settings for device 10 (e.g., a range of different spacings D between optical modules 36).

Figure 14:
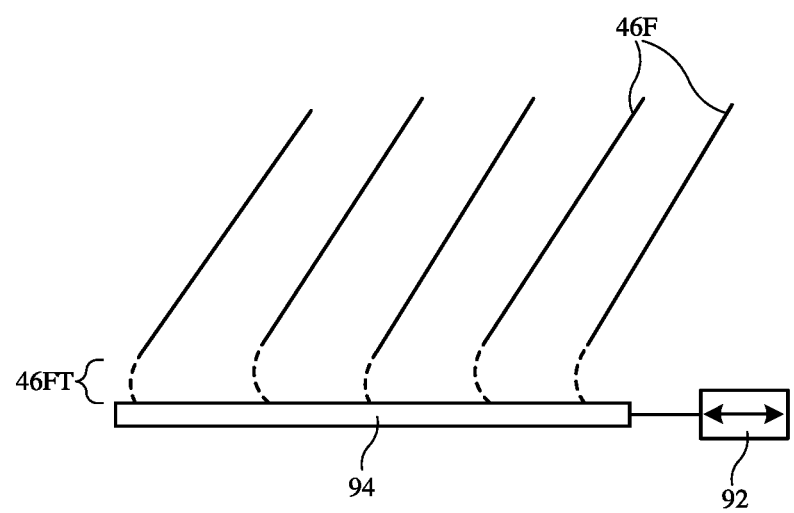
FIG. 14 is a cross-sectional side view of an illustrative heat sink with bendable fins in accordance with an embodiment.

If desired, the shapes of fins 46F may be adjusted in addition to or instead of adjusting the orientation of fins 46F. This type of approach is illustrated in FIG. 14. In the example of FIG. 14, actuator 92 pulls and pushes on the ends 46FT of fins 46F using member 94. Fins 46F are stiff along most of their lengths, but are flexible at ends 46FT, which are coupled to member 94. When member 94 is moved laterally, ends 96 may bend and thereby change the airflow characteristics of heat sink 46.

Figure 15:
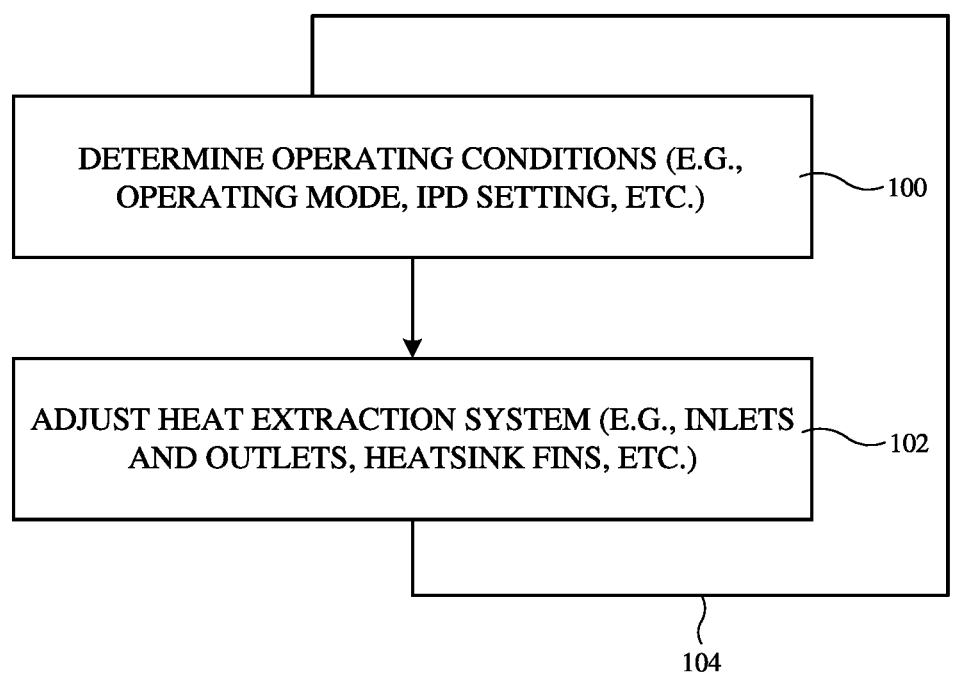
FIG. 15 is a flow chart of illustrative operations involved in operating a head-mounted electronic device with an adjustable heat extraction system in accordance with an embodiment.

Illustrative operations involved in using device 10 are shown in FIG. 15. During the operations of block 100, control circuitry 12 may gather information on the operating state of device 10. Control circuitry 12 may, for example, determine whether device 10 is fully operational and is displaying information on displays 14. Control circuitry 12 may use sensors 16 to determine the temperature of heat-producing components (e.g., displays 14) that are being cooled using heat sinks 46. Control circuitry 46 may also use sensors 16 (e.g., encoders in actuators 48 or other sensors) to determine the value of spacing D between optical modules 36.

During the operations of block 102, control circuitry 12 can adjust the heat extraction system of device 10 based on information on whether device 10 is on or off, the measured temperature of displays 14, the measured value of spacing D, and/or other information. As an example, louvers 62 may be moved to open, close, or partly close airflow inlet 52 and/or airflow outlet 50, fan speeds may be adjusted, and/or heat sinks 46 may be adjusted (e.g. airflow ports, fan speeds, and/or heat sinks 46 may be adjusted based on optical module spacing, based on temperature, based on whether device 10 is on or off, and/or based on other information).

As shown by line 104, the operations of FIG. 15 may be performed continuously. When components in device 10 such as displays 14 are producing relatively less heat (e.g., when displays 14 have a low brightness setting, when video is displayed with a low refresh rate, low resolution, and/or other settings that cause power consumption to drop, and/or when the measured temperature of displays 14 is low, airflow ports may be closed (or at least partly closed), fan speeds may be reduced, and/or other actions may be taken that tend to lower the amount of heat being extracted by the heat extraction system. When displays 14 are heavily loaded (e.g., with rapidly changing high-resolution content at high brightness), the airflow ports may be fully opened and fan speeds may be increased. Interpupillary distance changes that affect airflow impedance through the heat extraction system can be accommodated by changing heat sink fin orientation and/or by adjusting the louvers in the airflow ports.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

Physical environment: A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

Computer-generated reality: in contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands). A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects. Examples of CGR include virtual reality and mixed reality.

Virtual reality: A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

Mixed reality: In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end. In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationary with respect to the physical ground. Examples of mixed realities include augmented reality and augmented virtuality. Augmented reality: an augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s)

to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment. An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof. Augmented virtuality: an augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

Hardware: there are many different types of electronic systems that enable a person to sense and/or interact with various CGR environments. Examples include head mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head mounted system may have one or more speaker(s) and an integrated opaque display. Alternatively, a head mounted system may be configured to accept an external opaque display (e.g., a smartphone). The head mounted system may incorporate one or more imaging sensors to capture images or video of the physical environment, and/or one or more microphones to capture audio of the physical environment. Rather than an opaque display, a head mounted system may have a transparent or translucent display. The transparent or translucent display may have a medium through which light representative of images is directed to a person's eyes. The display may utilize digital light projection, OLEDs, LEDs, μLEDs, liquid crystal on silicon, laser scanning light sources, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

The foregoing is merely illustrative and various modifications can be made to the described embodiments. The foregoing embodiments may be implemented individually or in any combination.

What is claimed is:

1. A head-mounted device, comprising:
   a head-mounted support structure;
   first and second displays supported by the head-mounted support structure and configured to provide images that are viewable from eye boxes; and
   a first heat sink attached to the first display and a second heat sink attached to the second display, wherein a distance between the first and second heat sinks is adjustable and wherein the first and second heat sinks are rotated as the distance is adjusted.

2. The head-mounted device defined in claim 1 further comprising a positioner configured to adjust the distance between the first and second heat sinks.

3. The head-mounted device defined in claim 2 further comprising first and second lenses, wherein the first lens and the first display are mounted in a first lens barrel and wherein the second lens and the second display are mounted in a second lens barrel.

4. The head-mounted device defined in claim 3 wherein the positioner is configured to adjust a position of the first and second lens barrels to accommodate a given interpupillary distance.

5. The head-mounted device defined in claim 1 further comprising a first fan coupled to the first display and a second fan coupled to the second display.

6. The head-mounted device defined in claim 5 wherein the first heat sink is sandwiched between the first display and the first fan and wherein the second heat sink is sandwiched between the second display and the second fan.

7. The head-mounted device defined in claim 5 further comprising:
   a first thermally conductive layer interposed between the first fan and the first display; and
   a second thermally conductive layer interposed between the second fan and the second display.

8. The head-mounted device defined in claim 1 wherein the head-mounted support structure comprises an adjustable airflow port.

9. The head-mounted device defined in claim 8 further comprising an actuator configured to adjust the adjustable airflow port.

10. The head-mounted device defined in claim 1 wherein the first and second heat sinks each have adjustable heat sink fins.

11. A head-mounted device, comprising:
    a head-mounted support structure;
    a display supported by the head-mounted support structure and configured to provide an image that is viewable from an eye box;
    a fan configured to cool the display; and
    a heat sink sandwiched between the fan and the display, wherein the heat sink has adjustable heat sink fins having an orientation that is adjusted based on a position of the display and the heat sink.

12. The head-mounted device defined in claim 11 further comprising a thermally conductive layer interposed between the display and the heat sink.

13. The head-mounted device defined in claim 11 further comprising an actuator configured to adjust the adjustable heat sink fins.

14. The head-mounted device defined in claim 11 further comprising an airflow port having adjustable louvers.

15. A head-mounted device, comprising:
- a head-mounted support structure;
- a display and lens supported by the head-mounted support structure, wherein the display is configured to provide an image that is viewable through the lens from an eye box;
- a heat sink attached to the display, wherein the display is sandwiched between the heat sink and the lens; and
- a positioner configured to adjust a position of the display and the heat sink, wherein the heat sink comprises heat sink fins having an orientation that is adjusted based on the position of the display and the heat sink.

16. The head-mounted device defined in claim 15 further comprising a fan, wherein the heat sink is sandwiched between the display and the fan.

17. The head-mounted device defined in claim 15 further comprising:
- an airflow port having louvers; and
- an actuator configured to adjust the louvers.

18. The head-mounted device defined in claim 15 wherein the positioner is configured to adjust the position of the display and the heat sink based on a given interpupillary distance.

* * * * *